United States Patent
Anderson et al.

(10) Patent No.: US 9,922,154 B2
(45) Date of Patent: Mar. 20, 2018

(54) ENABLING AN INCREMENTAL SIGN-OFF PROCESS USING DESIGN DATA

(71) Applicant: International Business Machines Corporation, Armonk, NY (US)

(72) Inventors: Hans-Werner Anderson, Filderstadt (DE); Joachim Keinert, Altdorf (DE); Jens Noack, Stuttgart (DE); Holger Wetter, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 15/160,658

(22) Filed: May 20, 2016

(65) Prior Publication Data
US 2017/0337314 A1    Nov. 23, 2017

(51) Int. Cl.
G06F 17/50    (2006.01)

(52) U.S. Cl.
CPC ...... *G06F 17/5045* (2013.01); *G06F 17/5072* (2013.01); *G06F 17/5081* (2013.01); *G06F 2217/74* (2013.01)

(58) Field of Classification Search
CPC ............. G06F 17/5054; G06F 17/5081; G06F 17/5045; G06F 2217/74
USPC ................... 716/107, 111, 136, 103; 703/15
See application file for complete search history.

(56) References Cited

U.S. PATENT DOCUMENTS

| | | | |
|---|---|---|---|
| 6,226,777 B1 * | 5/2001 | Zhang | G06F 17/504 716/104 |
| 7,111,269 B2 | 9/2006 | Satapathy et al. | |
| 7,171,639 B2 | 1/2007 | Genz et al. | |
| 7,546,565 B2 | 6/2009 | Fenkes et al. | |
| 8,255,846 B2 | 8/2012 | Binder et al. | |
| 8,615,691 B2 * | 12/2013 | Dokken | G01R 31/318533 714/726 |
| 9,141,741 B1 * | 9/2015 | Lin | G06F 17/5045 |
| 2001/0048333 A1 * | 12/2001 | Fujii | G06F 1/10 327/270 |
| 2005/0283744 A1 * | 12/2005 | Mochizuki | G06F 17/5022 716/104 |
| 2007/0288219 A1 | 12/2007 | Zafar et al. | |
| 2009/0228849 A1 | 9/2009 | Mossawir et al. | |
| 2009/0307640 A1 * | 12/2009 | Chapman | G06F 17/5045 716/136 |

(Continued)

FOREIGN PATENT DOCUMENTS

| | | |
|---|---|---|
| CN | 104091161 A | 10/2014 |
| EP | 2135184 A2 | 12/2009 |

(Continued)

*Primary Examiner* — Phallaka Kik
(74) *Attorney, Agent, or Firm* — Jared L. Montanaro

(57) ABSTRACT

A computer system may obtain a first schematic design netlist for a first IC design and a second schematic design netlist for a second IC design. The computer system may normalize the first netlist and the second netlist. The computer system may determine that the normalized first netlist is the same as the normalized second netlist. The computer system may obtain a first layout design data for the first IC design and a second layout design data for the second IC design. The computer system may determine that the first layout data is the same as the second layout data. The computer system may copy a sign-off data of the first IC design to the second IC design.

20 Claims, 7 Drawing Sheets

(56) References Cited

U.S. PATENT DOCUMENTS

2009/0319977 A1* 12/2009 Saxena ............... G06F 17/5077
716/129

FOREIGN PATENT DOCUMENTS

| WO | 2008009550 A2 | 1/2008 |
| WO | 2008112605 A2 | 9/2008 |

* cited by examiner

```
                                                              400A
                                  Netlist 1
  PRTDEF DI_REG_6 DEVICE           } 402A
    Time Stamp="Dec 10 10:09:20 2014"

NET DLYLCK_DC                    } 404A
  NET net35

PPIN DLYLCK_DC I DLYLCK_DC       } 406A
  PPIN net019

USGDEF I13 INV_H C_A=0.5109518f C_Y=0.562084f CBtime="Dec 10 10:09:20 2014"
  CBver=...                                                                  } 408A
    UPIN Y OUTPUT ABIST_EN_LOC
    UPIN A INPUT net35
    UPIN B INPUT net018

USGDEF ILCBES LCBES_X2 fipBit=0 fipGroupName=None refCell=LCBES_X2
    UPIN LCK OUTPUT net35                                             } 410A
    UPIN SDCK OUTPUT net018
    UPIN SDIS INPUT net024
```

FIG. 4A

```
                                                              400B
                                  Netlist 1
  PRTDEF DI_REG_6 DEVICE           } 402B PPIN DLYLCK_DC I DLYLCK_DC       } 406B
  PPIN net1

USGDEF I13 INV_H C_A=0.5109518f C_Y=0.562084f CBtime="Dec 10 10:09:20 2014"
  CBver=...                                                                  } 408B
    UPIN Y OUTPUT ABIST_EN_LOC
    UPIN A INPUT net2
    UPIN B INPUT net3

USGDEF ILCBES LCBES_X2 fipBit=0 fipGroupName=None refCell=LCBES_X2
    UPIN LCK OUTPUT net2                                              } 410B
    UPIN SDCK OUTPUT net3
    UPIN SDIS INPUT net4
```

ENABLING AN INCREMENTAL SIGN-OFF PROCESS USING DESIGN DATA

BACKGROUND

The present disclosure relates generally to the field of integrated circuit (IC) design, and more specifically to copying sign-off data from a first IC design to a second IC design.

An IC may be designed by combining multiple blocks (e.g., subcomponents of an IC, which may also be ICs, such as logic gates). Before the IC can be manufactured sign-off data such as, timing data, noise data, extraction data, voltage drop data, etc., may be produced. To produce the sign-off data for the IC, each block must go through a sign-off process. The sign-off process for the IC may take days to complete by having to analyze each block and many ICs use the same blocks.

SUMMARY

Embodiments of the present invention disclose a method, computer program product, and system for comparing integrated circuit (IC) design data. A computer system may obtain a first netlist for a first IC design and a second netlist for a second IC design. The computer system may normalize the first netlist and the second netlist. The computer system may determine that the normalized first netlist is the same as the normalized second netlist. The computer system may obtain a first layout design data for the first IC design and a second layout design data for the second IC design. The computer system may determine that the first layout data is the same as the second layout data. The computer system may copy a sign-off data of the first IC design to the second IC design.

In some embodiments of the present invention, a computer system may obtain a first netlist for a first block and a second netlist for a second block. The computer system may normalize the first netlist and the second netlist. The computer system may determine that the normalized first netlist is the same as the normalized second netlist. The computer system may obtain a first layout design data for the first block and a second layout design data for the second block. The computer system may determine that the first layout data is the same as the second layout data. The computer system may copy a sign-off data of the first block to the second block.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

FIG. 4A illustrates an example of a textual representation of a first netlist, in accordance with embodiments of the present disclosure.

FIG. 4B illustrates an example of a textual representation of the first netlist from FIG. 4A after normalization, in accordance with embodiments of the present disclosure.

Figure 1:
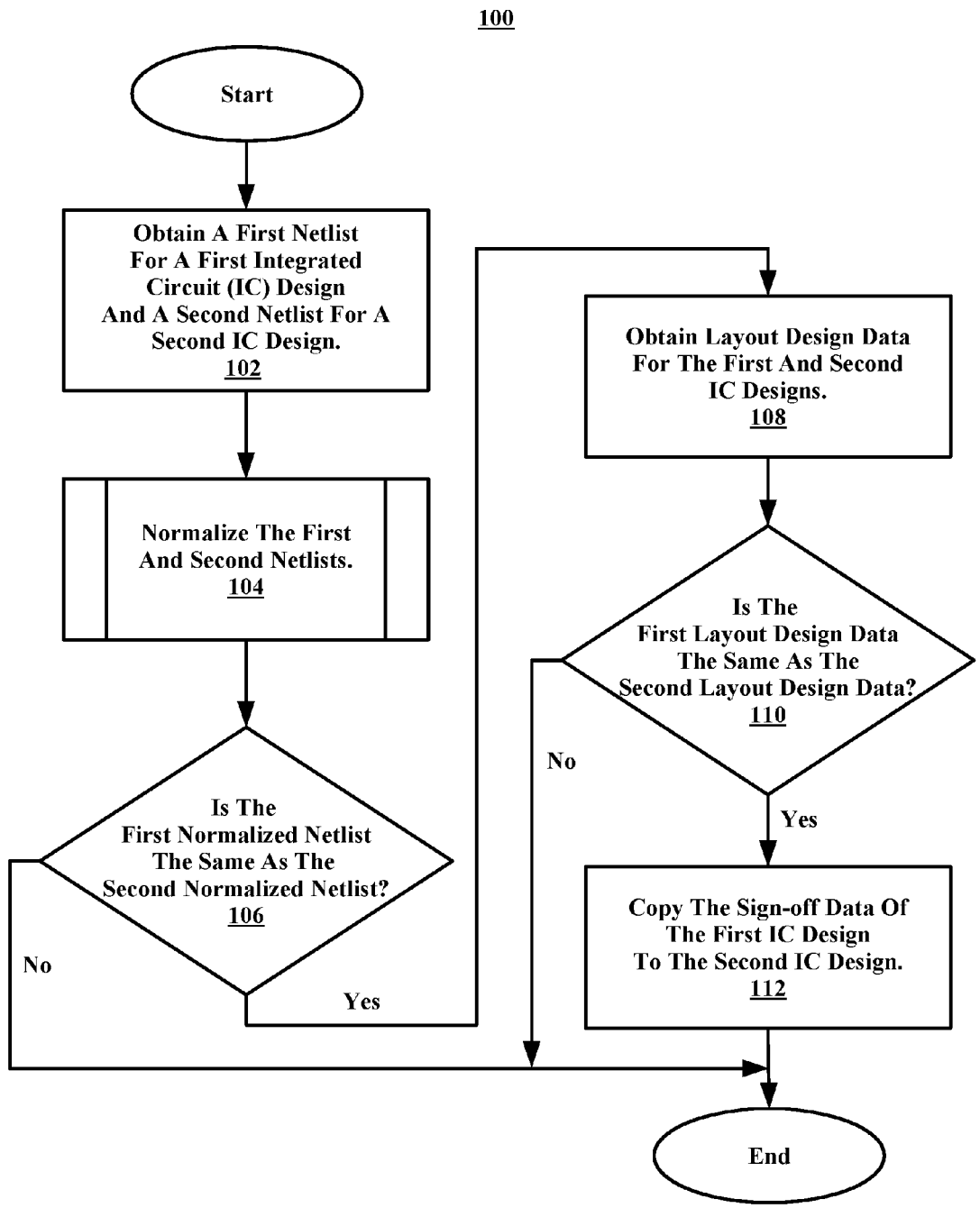
FIG. 1 illustrates a flowchart depicting an example method for copying sign-off data of a first IC design to a second IC design, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of present disclosure relate generally to the field of integrated circuit (IC) design, and more specifically to copying sign-off data from a first IC design to a second IC design. While the present disclosure is not necessarily limited to such applications, various aspects of the disclosure may be appreciated through a discussion of various examples using this context.

During the project phase of designing an IC, the IC may go through multiple iterations (e.g., versions or releases). Each iteration of the IC may be designed using one or more subcomponents, also referred to herein as "blocks." The subcomponents (e.g., blocks) may include, but are not limited to, individual transistors, logic gates, combinations of logic gates, other IC designs, and combinations of other IC designs. One or more of the blocks in the IC may itself be made up of one or more blocks. For example, an IC may include a block for a NAND gate, which may itself be made up of two blocks: an AND gate and an inverter.

In some embodiments, the subcomponents that make up the IC may be stored using an array. The array of IC designs may be a list that identifies each IC design used separately and in combination to design the IC. For example, using the previously mentioned NAND gate, the array may include an entry for the NAND gate as a whole, as well as entries for the AND gate and inverter that make up the NAND gate. Each IC design in the array may need to go through a sign-off process to assure the functionality of the IC before the IC may be sent out for manufacture. The sign-off process may include generating, among other things, timing data, noise data, extraction data, voltage drop data, design rule checking (DRC) data, and layout versus schematic (LVS) data of the block. Performing the sign-off process for each IC design in the array may take days to complete.

However, many iterations of the IC in the design process may use the same IC design. By copying sign-off data already generated for an IC design in one array to the same IC design in another array, the sign-off process may take minutes to complete. That is, only IC designs with no sign-off data already generated from prior iterations may need to go through the complete sign-off process. In some embodiments, each IC design may be associated to a different hierarchy of the circuit (e.g., one IC design is an inverter, one IC design is an AND gate, one IC design is the combination of the inverter and gate to produce a NAND gate, etc.). In some embodiments, the level of granularity may be decided by a user (e.g., a NAND gate composed of a combination is the lowest level in a hierarchy).

In some embodiments, a first array may have a first IC design and a second array may have a second IC design. In some embodiments, the first IC design is a first release of an IC and the second IC design is a second release of the same IC. A computer system (e.g., a processor) may obtain (e.g., receive, generate, etc.) a first netlist for the first IC design and a second netlist for the second IC design. In some embodiments, the first netlist may be a first schematic (e.g., logical) design data for the first IC design and the second netlist may be a second schematic design data for the second IC design. The first and second netlists may be textual representations of the first and second schematic design data, respectively.

For example, the computer system may receive the first schematic design data and the second schematic design data as pictorial representations of the first and second IC designs, respectively. The first and second IC designs may be pictorial representations of inverters. The computer system may identify the textual statements used to generate the pictorial representation of the inverters and generate the first netlist and second netlist as a listing of the textual statements (e.g., the inputs and outputs of the inverters).

The first netlist and the second netlist may be normalized in order to prepare the first netlist and second netlist for a textual difference analysis. To normalize the first netlist and second netlist, a computer system may identify one or more statements in the first netlist and the second netlist. The computer system may order each statement in the first netlist and the second netlist. The computer system may generate new netnames for each netname in each statement. The computer system may additionally replace each netname with the new netname.

For example, the first netlist and the second netlist may be analyzed by a computer system. The computer system may determine that there are one or more proto pin (PPIN) statements in the first and second netlists. The one or more PPIN statements may be output PPIN statements and input PPIN statements. The computer system may order the output PPIN statements alphabetically and then order the input PPIN statements alphabetically after the output PPIN statements.

The computer system may also determine that there are one or more usage definition (USGDEF) statements in the first netlist and the second netlist. The USGDEF statements may then be ordered alphabetically. The computer system may also determine there are one or more usage pin (UPIN) statements in the first netlist and the second netlist. The one or more UPIN statements may be output UPIN statements and input UPIN statements. The computer system may order the output UPIN statements alphabetically and then order the input UPIN statements alphabetically after the output UPIN statements.

In some embodiments, to generate the new netnames for each netname in each statement, the computer system may generate a first hash table for the first netlist and a second hash table for the second netlist. The computer system may analyze each statement in the first netlist and the second netlist for each netname. The computer system may continue to add each netname in the first netlist to the first hash table and each netname in the second netlist to the second hash table. The netnames may act as keys to produce each new netname.

For example, a first hash table may be generated for the first netlist and a second hash table may be generated for the second netlist. In some embodiments, the first hash table and the second hash table may be generated as empty and have an index of 1 (e.g., as the first and second hash tables are populated they may output values in a sequential order of 1, 2, 3, . . . N). The computer system may then analyze the one or more PPIN and one or more UPIN statements in the first netlist and the second netlist. The computer system may identify each netname in the one or more PPIN and one or more UPIN statements. The netnames may be random names generated by the schematic design program and given to each input/output component of the first block and the second block.

The computer system may determine whether each netname in the first netlist is in the first hash table and whether each netname in the second netlist is in the second hash table. If the netname in the first netlist is not in the first hash table, the computer system may add the netname to the first hash table. Additionally, if the netname in the second netlist is not in the second hash table, the computer system may add the netname to the second hash table. In some embodiments, the netnames are added to the first and second hash tables as keys (e.g. inputs used to derive a hash value).

The computer system may generate corresponding netnames in the first hash table and the second hash table for each netname added to the first hash table and each netname added the second hash table. That is, the computer system using the netnames as keys in the hash table and the index of 1 (e.g., sequentially appending numbers to the netnames by increments of 1) may produce hashed netnames to replace each netname. In some embodiments, the index may be any number and the netnames may be hashed by any technique known in the art. In some embodiments, normalizing the netlists includes generating a common netname for corresponding components (e.g., nets) in the IC. For example, a first component in a first IC design may have a corresponding second component in a second IC design that is the same type of component and in the same place in the IC designs. Normalizing the netlists may include generating a common netname for the first and second components so that they are compared to each other when the netlists are compared.

For example, the computer system may generate an empty hash table for the first netlist. The computer system may analyze each PPIN statement and UPIN statement in the first netlist. While analyzing each PPIN statement and UPIN statement, the computer system may identify each netname such as net012, net233, and net96 in the PPIN statements and UPIN statements. The computer system can further add each netname not already in the first hash table to the first hash table. The netnames can act as keys in the hash table, as shown below in Table 1.

TABLE 1

| Key | Index | New Netname |
|---|---|---|
| net012 | 1 | net1 |
| net233 | 2 | net2 |
| net96 | 3 | net3 |

The computer system may use the first hash table to generate corresponding netnames net1, net2, and net3 for net012, net233, and net96, respectively. The hash function embedded in the first hash table can remove respective numerals from respective netnames and append sequential identifiers to the respective netnames based on an index of 1. That is, the corresponding netnames increase by one integer at a time (e.g., 1, 2, 3, . . . N).

In some embodiments, the computer system may also generate a second empty hash table for the second netlist. The computer system may analyze each PPIN statement and UPIN statement in the second netlist. While analyzing each PPIN statement and UPIN statement, the computer system may identify each netname, such as net111, net456, and net34 in the PPIN statements and UPIN statements. The computer system can further add each netname not already in the second hash table to the second hash table. The netnames may act as keys in the hash table, as shown below in Table 2.

TABLE 2

| Key | Index | New Netname |
|---|---|---|
| net111 | 1 | net1 |
| net456 | 2 | net2 |
| net34 | 3 | net3 |

The computer system may use the second hash table to generate corresponding netnames net1, net2, and net3 for net111, net456, and net34, respectively. The hash function embedded in the second hash table can remove respective numerals from respective netnames and append sequential identifiers to the respective netnames based on an index of 1. That is, the corresponding netnames increase by one integer at a time (e.g., 1, 2, 3, . . . N). It may be noted that the first hash table and the second hash table each generated the same sequence of corresponding netnames (e.g., net1, net2, and net3).

In some embodiments, the computer system may analyze each line in the first netlist and the second netlist, replacing each netname in the one or more PPIN statements and the one or more UPIN statements with each corresponding netname found in the first netlist and the second netlist. For example, the UPIN statement of UPIN Y net675 in the first netlist may have the netname net675 replaced with net1 to fully read as UPIN Y net1. Additionally, the UPIN statement of UPIN A net908 in the second netlist may have the netname net908 replaced with net1 to fully read as UPIN A net1.

In some embodiments, the computer system may remove information that is unrelated to the schematic design of the ICs from the netlists. Such information may include, but is not limited to, information pertaining to when the netlist was generated (e.g., time and dates) and information related to who generated the netlist (e.g., information identifying the computer system or software used to create the netlists).

For example, in some embodiments, the computer system may determine that there are one or more printer definition (PRTDEF) statements in the first netlist and the second netlist. The computer system may then delete each time-date stamp in the one or more PRTDEF statements. The computer system deletes the time-date stamps because they can be arbitrary to the main function of the netlist and skew the textual difference analysis if they remain intact. For example, the computer system may determine that there is the PRTDEF statement of PRTDEF "Oct 30 10:10:23 2015" in the first netlist and the PRTDEF statement of PRTDEF "Nov 15 11:35:34 2015" in the second netlist. The computer system may then delete the "Oct 30 10:10:23 2015" portion of the PRTDEF statement in the first netlist and the "Nov 15 11:35:34 2015" portion of the PRTDEF statement in the second netlist.

The computer system may determine that there are one or more internal connection (NET) statements in the first netlist and the second netlist. Each NET statement in the first netlist and the second netlist may then be deleted. The NET statements may be deleted because they are internal connections that relatively negligibly affect the sign-off data and are available in the PPIN or UPIN statements if needed. For example, the first netlist may have a list of NET statements such as, for example, NET abc123, NET def456, and NET ghi789. The example list of NET statements can be deleted in accordance with embodiments of the present disclosure.

The computer system may determine that the normalized first netlist and the normalized second netlist are the same. That is, after the statements in the first netlist and the second netlist have been ordered and augmented by deletions or replacements, it may be determined that the first netlist and the second netlist are the same. In some embodiments, the computer system may use a textual difference method, technique, or program that determines if the text of each netlist is the same to compare the first netlist and the second netlist.

The computer system may obtain a first layout design (e.g., physical design) data for the first IC design and a second layout design data for the second IC design. The computer system may then determine that the first layout design data is the same as the second layout design data. In some embodiments, the first layout design data and the second layout design data may be compared by using a shape-comparing method or program. For example, the first IC design may be a 4 mm by 4 mm square with one hole in the exact middle. The second IC design may also be a 4 mm by 4 mm square with one hole in the exact middle. A shape-comparing program may then overlay the two images of the first schematic design data and second schematic design data and determine the first and second IC designs are the same schematically. The computer system may compare the layout design data before or after the analysis of the schematic design data. For example, in some embodiments the computer system may compare the layout design data in response to determining that the schematic design data (e.g., the netlists) are the same, and in other embodiments the computer system may compare the netlists in response to determining that the layout design data is the same.

In response to determining that the first netlist is the same as the second netlist and that the first layout design data is the same as the second layout design data, the computer system may copy sign-off data already generated for the first IC design to the second IC design, for which no sign-off data has been generated. The copying of sign-off data may save time and computational power by not having to perform all sign-off procedures again for the second IC design. A person having ordinary skill in the art would recognize that the first IC design and the second IC design may be one of many IC designs (e.g., blocks) that compose an IC to be compared.

In some embodiments, the first IC design and the second IC design may be of the same hierarchical class. For example, the first IC design may be a low level hierarchical IC design (e.g., a single logic gate), or AND gate, and the second IC design may be a low level hierarchical IC design, also an AND gate. A computer system may compare the first IC design to the second IC design because they are both low level IC designs and determine that they are both AND gates. The computer system may then copy the first IC design sign-off data to the second IC design and continue to analyze the increasing hierarchical IC designs. For example, a third IC design that is a full-ADDER (e.g., a combination of lower level hierarchical IC designs, in this case, a combination of logic gates) may be compared to a fourth IC design that is a half-ADDER. Both the third IC design and the fourth IC design may be on the same hierarchical level. However, the computer system may determine that the third IC design and the fourth IC design are not the same, physically or in terms of netlists, and not copy the third IC design sign-off data to the fourth IC design.

In some embodiments, the first netlist may be a textual representation of a first integrated circuit made up of multiple IC designs, and the second netlist may be a textual representation of a second integrated circuit made up of multiple IC designs. For example, the first integrated circuit may be composed of an AND, OR, and a NAND latch IC designs. The computer system may generate the first netlist as a textual representation of the AND, OR, and NAND latch IC designs. The second integrated circuit may be composed of an XOR and a D latch IC designs, and the computer system may generate the second netlist as a textual representation of the XOR and D latch IC designs. The computer system may compare the first netlist and second netlist and not copy the sign-off data for the first integrated circuit to the second integrated circuit in response to determining that the first netlist and second netlist are not the same.

Referring now to FIG. 1, illustrated is a flowchart of an example method 100 for copying sign-off data of a first IC design to a second IC design, according to embodiments. A computer system may perform method 100. In some embodiments, a user may perform one or more operations in the method 100. In other embodiments, one or more operations in the method 100 may be performed by the computer system in response to user input. The method 100 may begin at operation 102, where the computer system may obtain a first netlist for a first IC design and a second netlist for a second IC design. In some embodiments, the first netlist and second netlist contain schematic design data (e.g., logical design data).

In some embodiments, the first IC design may be a subcomponent of a larger IC design for a first iteration of an IC, and the second IC design may be a subcomponent of the larger IC design for a second iteration of the same IC. In other words, the first IC design may be a single component (e.g., an AND gate) of a first version of a larger integrated circuit (e.g., a NAND gate), and the second IC design may be a single component of the second version of the larger integrated circuit. The second IC design may be of an equivalent hierarchy as the first IC design (e.g., the first and second IC designs may be single logic gates for the IC design). For example, the first iteration of the IC may have subcomponents including an XOR as the first IC design. Next, the second iteration of the same IC may be produced and the second iteration may include a NAND as the second IC design instead of the XOR. The NAND gate in the second iteration is equivalent in hierarchy to the XOR gate of the first iteration.

In some embodiments, the first netlist and the second netlist may be textual representations of the first IC design and the second IC design, respectively. For example, the first IC design may be a FLIP-FLOP, the computer system may obtain the first netlist as a textual representation of the FLIP-FLOP, by detailing in words the inputs, outputs, and components used to make the FLIP-FLOP. In other embodiments, to obtain the first and second netlists, the computer system may receive the textual information from the user. In other embodiments, the computer system may generate the first and second netlists.

After obtaining the first netlist and the second netlist at operation 102, the computer system may normalize the first netlist and the second netlist at operation 104. Operation 104 is discussed further hereinafter with respect to FIG. 2 and FIG. 3. In some embodiments, normalizing the netlists may be done so that textual analysis of the netlists will compare corresponding components in the respective netlists to each other. In some embodiments, the computer system may normalize the first netlist and the second netlist by replacing each netname in the first netlist and the second netlist with a new netname that is generated in a sequential order.

For example, the first netlist may have three netnames: netname45, netname1211, and netname983. The computer system may analyze the netnames and replace netname45 with netname1, netname1211 with netname2, and netname983 with netname3. The computer system may also analyze the second netlist that may have three netnames: netname654, netname685, and netname344. While analyzing the second netlist, the computer system may replace netname654 with netname1, netname685 with netname2, and netname344 with netname3. It is noted that the first netlist and second netlist are now normalized because they both have the same associated netnames.

After normalizing the first netlist and the second netlist at operation 104, the computer system may determine whether the first normalized netlist is the same as the second normalized netlist at decision block 106. In some embodiments, the computer system may determine whether the first normalized netlist is the same as the second normalized netlist by textually comparing the first and second normalized netlist. For example, the first netlist may be "input netname1, output netname2, component 55" and the second netlist may be "input netname1, output netname2, component 45." The computer system may use a method, technique, or program that analyzes and compares the text of the second netlist with the text of the first netlist and determine that the first and second netlists are not the same (e.g., because the components of the first netlist and second netlist do not match).

If at decision block 106 the computer system determines that the first netlist and the second netlist are not the same, the method 100 may end and sign-off data for the second IC design may be generated. Because the normalized netlists don't match, the sign-off data for the first IC design cannot be copied to the second IC design. If at decision block 106 the computer system determines that the first netlist is the same as the second netlist, the method 100 may continue to operation 108.

At operation 108, the computer system may obtain layout design data for the first IC design and the second IC design. A person having ordinary skill in the art would recognize that layout design data (e.g., physical design data) is different from schematic design data and denotes the actual appearance of the first and second IC designs. For example, the layout design data may be similar to a blueprint that shows the physical location and shape of an IC design through pictures, whereas the schematic design data details the components of the IC design through text. In some embodiments, the computer system may obtain the layout design data for the first and second IC designs by a user uploading the layout design data for the first and second IC designs.

In some embodiments, the computer system may obtain the layout design data by accessing an IC design program. For example, the layout design data for the first and second IC designs may have been created using an IC design program or method. The computer may search the program for the first IC design's and second IC design's layout data and pull the information for analysis.

After obtaining the layout design data for the first and second IC designs at operation 108, the computer system may determine whether the first layout design data (e.g., the layout design data for the first IC design) is the same as the second layout design data (e.g., the layout design data for the second IC design) at decision block 110. In some embodiments, the computer system may determine that the first and second layout design data is the same by comparing the shape of the first and second layout designs.

For example, the first IC design may have a layout design of an OR gate on top, an AND gate on bottom, and the outputs of the OR and AND gates may be inputs into a NOR gate in the middle. The second IC design may have a layout design of an OR gate on top, an AND gate on bottom, and the outputs of the OR and AND gates may be inputs into a NOR gate in the middle. The computer system may superimpose the second layout design data over the first layout design data and determine that the layout designs are the same. A person having ordinary skill in the art would recognize many methods for superimposing the first layout design data over the second layout design data and determining whether the first and second layout design data are the same.

If the computer system determines that the first layout design data is not the same as the second layout design data, the method 100 may end at decision block 110. If the computer system determines that the first layout design is the same as the second layout design data, the method 100 may proceed to operation 112.

At operation 112, the computer system may copy the sign-off data of the first IC design to the second IC design, saving time and computing power by not having to run sign-off procedures for the second IC design. For example, the computer system may determine that the first netlist is the same as the second netlist. The first netlist and the second netlist both having four input components named netname1, netname2, netname3, and netname4, and one output named netname5. The computer system may also determine that the layout design data of the first IC design and the second IC design are the same. The layout design data of the first IC design and the second IC design both having an OR gate on top, an AND gate on bottom, and an NOR gate in the middle.

After determining that both the netlists and layout design data for the first IC design and second IC design are the same, the computer system may copy the sign-off data of the first IC design to the second IC design. This may be done because the first IC design is a part of an earlier iteration of an IC that has already had sign-off data performed. Additionally, the second IC design may be a part of a later iteration of the same IC.

In some embodiments, the sign-off data of the first IC design may only be copied to the second IC design if both the first and second netlists, and first and second layout design data match. In some embodiments, partial sign-off data of the first IC design may be copied to the second IC design. For example, a first IC design may be an OR gate generated for an iteration of an IC that only needed sign-off data relating to voltage drop, and the voltage drop sign-off data may be housed in a repository to be accessed later. A second IC design may be an OR gate generated for an iteration of the same IC, but sign-off data for voltage drop and noise may now be needed. The computer system may determine that the OR gates are the same logically and physically (e.g., the netlists and layout designs match), and copy the voltage drop data for the first IC design from the repository to the second IC design. The computer system may then run a sign-off procedure for noise data only because the voltage drop data has already been generated for the first IC design and shared with the second IC design. The method 100 may end after all sign-off data required by the second IC design is copied from the first IC design at operation 112.

In some embodiments, the sign-off data for an IC may be kept in an array. If the IC is made up of multiple blocks (e.g., IC designs), each block may have an entry in the array, which may contain sign-off data for the entire IC as well as sign-off data for each block. In these embodiments, the method 100 may be performed for each block. The sign-off data for matching blocks may be copied to a second array (e.g., for the second version or release), while sign-off data for blocks that do not match may not be copied to the second array.

Figure 2:
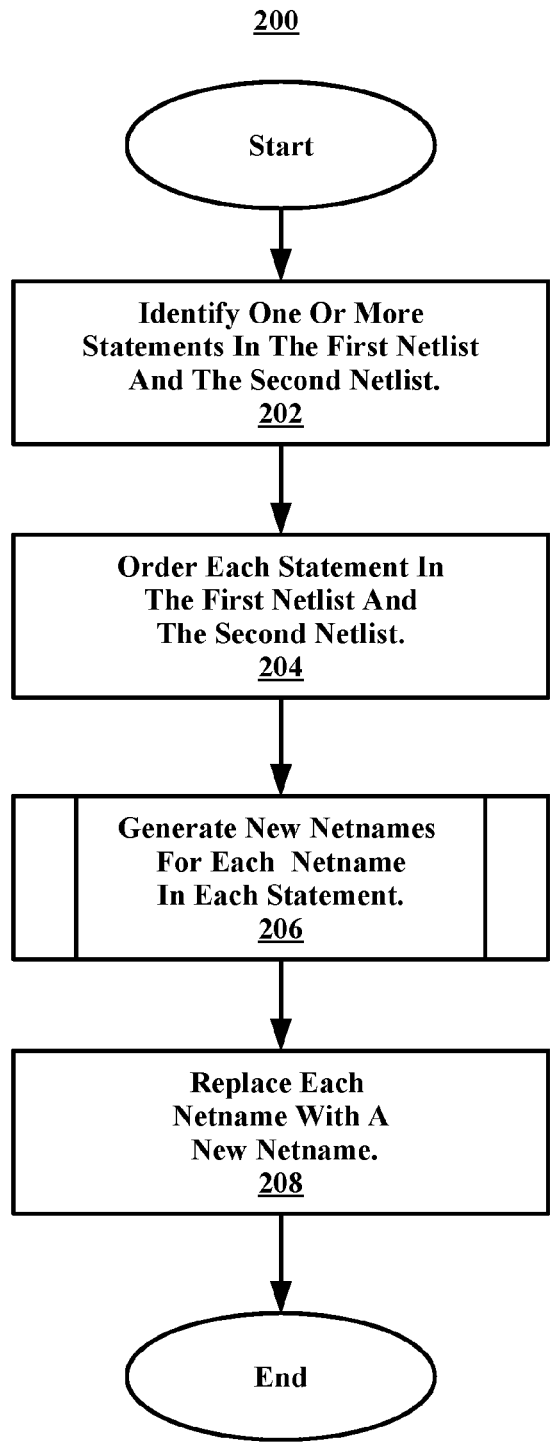
FIG. 2 illustrates a flowchart of an example method for normalizing a first netlist and a second netlist, in accordance with embodiments of the present disclosure.

Turning now to FIG. 2, illustrated is a flowchart of an example method 200 for normalizing the first netlist and the second netlist, according to embodiments. The method 200 may begin at operation 202 where the computer system may identify one or more statements in the first netlist and the second netlist. In some embodiments, the computer system may analyze each statement in the first and second netlists line-by-line, noting the designation of each statement (e.g., if the statement is a PRTDEF, NET, PPIN, USGDEF, or UPIN statement). In some embodiments, the computer system may delete arbitrary information such as the time-date stamp in the PRTDEF statements.

For example, the first netlist may have a PRTDEF statement, five UPIN statements, and three USGDEF statements listed. The computer system may analyze the first netlist line by line, making note that there is one PRTDEF statement, five UPIN statements, and three USGDEF statements in the first netlist. The computer system may then analyze the second netlist and note that there are two PRTDEF statements, six UPIN statements, and one USGDEF statement in the second netlist. In some embodiments, the computer system may analyze the first netlist and the second netlist simultaneously. In other embodiments, the netlists may be analyzed sequentially.

After identifying one or more statements in the first netlist and the second netlist at operation 202, the computer system may continue to operation 204. At operation 204, the computer system may order each statement in the first netlist and the second netlist. In some embodiments, the computer system may keep PRTDEF statements in the same order. In some embodiments, the computer system may additionally order output PPINs alphabetically, followed by the input PPINs ordered alphabetically. In some embodiments, the computer system may also alphabetically order the USGDEF statements by name. In some embodiments, the computer system may alphabetically order the output UPINs followed by the input UPINs in alphabetical order.

For example, the first netlist and the second netlist may have statements originally ordered as shown in Table 3:

TABLE 3

| First Netlist | Second Netlist |
| --- | --- |
| PRTDEF3 | PRTDEF1 |
| PRTDEF2 | PRTDEF2 |
| T output PPIN | S output PPIN |
| A input PPIN | B input PPIN |
| Y USGDEF | Z USGDEF |
| S output PPIN | T output PPIN |
| B input PPIN | A input PPIN |
| Z USGDEF | Y USGDEF |

The computer system may analyze the first and second netlists and re-order the statements as shown in Table 4:

TABLE 4

| First Netlist | Second Netlist |
| --- | --- |
| PRTDEF3 | PRTDEF1 |
| PRTDEF2 | PRTDEF2 |
| S output PPIN | S output PPIN |
| T output PPIN | T output PPIN |
| A input PPIN | A input PPIN |
| B input PPIN | B input PPIN |
| Y USGDEF | Y USGDEF |
| Z USGDEF | Z USGDEF |

Ordering the first netlist and the second netlist as shown in Table 4 allows for the computer system to textually compare the first netlist and the second netlist by performing a line by line comparison of the first and second netlists. As would be recognized by a person of ordinary skill in the art, the ordering of the first and second netlist may be done using any set of rules, and not just alphabetically or with the PRTDEF statements first.

After ordering each statement in the first netlist and the second netlist at operation 204, the computer system may proceed to generate new netnames for each netname in each statement at operation 206. In some embodiments, the new netnames are generated in a sequential order. The process for generating new netnames is discussed further in reference to FIG. 3.

Once the computer system has generated new netnames for each netname in each statement at operation 206, the computer system may proceed to operation 208, where each netname is replaced with a respective new netname. In some embodiments, the netname is replaced as the computer system orders the first and second netlists.

For example, the first netlist and second netlist may be ordered as listed below:

TABLE 5

| First Netlist | Second Netlist |
| --- | --- |
| B Output PPIN netname32 | A Output PPIN netname67 |
| Y Input PPIN netname65 | Y Input PPIN netname879 |
| A Output UPIN netname3232 | B Output UPIN netname3432 |
| Z Input UPIN netname 878 | Z Input UPIN netname 4343 |

As the computer system is ordering the statements, the computer system may also replace the netnames with sequentially generated, respective new netnames such as the netnames shown in Table 6:

TABLE 6

| First Netlist | Second Netlist |
| --- | --- |
| A Output UPIN netname1 | A Output PPIN netname1 |
| B Output PPIN netname2 | B Output UPIN netname2 |

TABLE 6-continued

| First Netlist | Second Netlist |
| --- | --- |
| Y Input PPIN netname3 | Y Input PPIN netname3 |
| Z Input UPIN netname4 | Z Input UPIN netname4 |

The new netnames allow the computer system to textually compare the first netlist and the second netlist. Without updating the netnames in a sequential order, arbitrary netnames generated when the netlists were created could skew the comparison process. After replacing each net name with a new net name, the method 200 may end.

Figure 3:
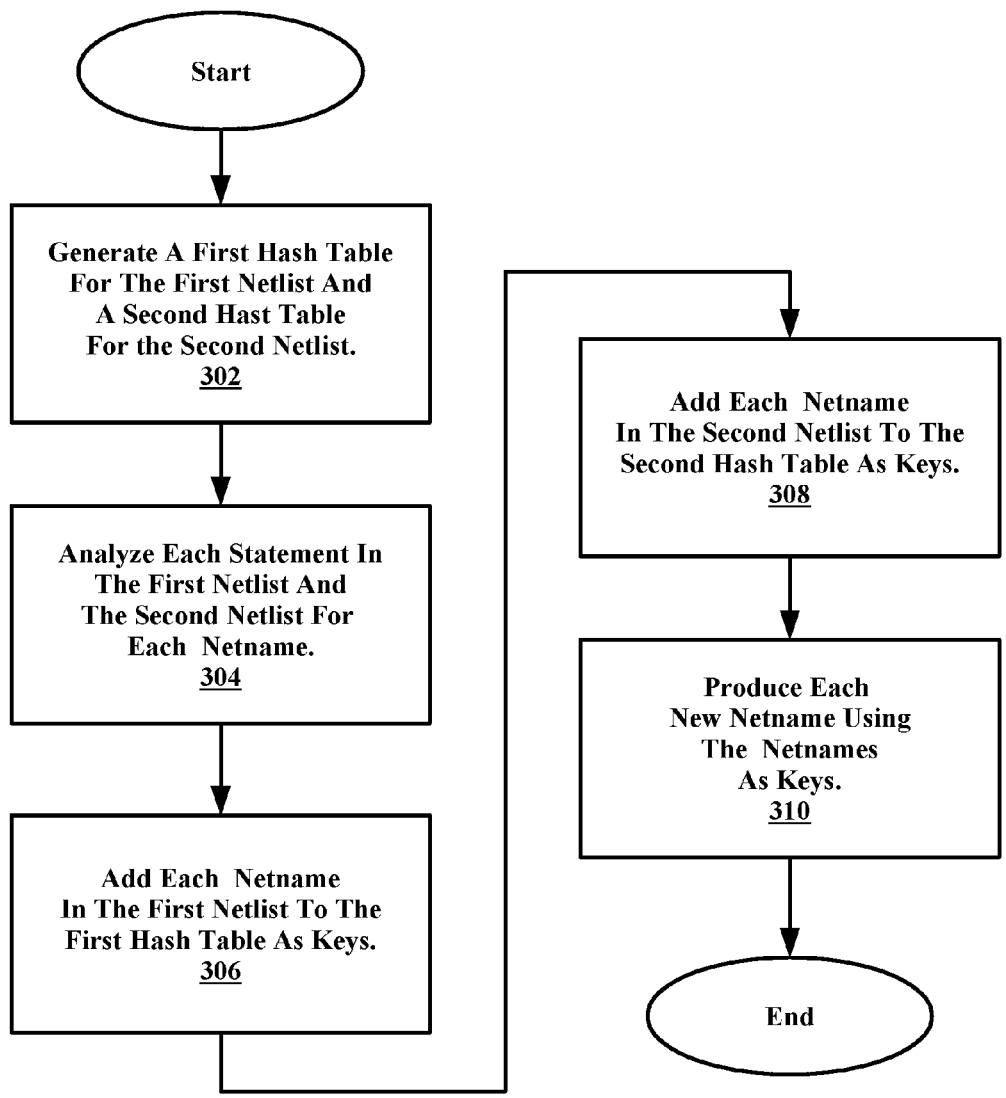
FIG. 3 illustrates a flowchart of an example method for generating new netnames for each netname in each statement of the first netlist and second netlist, in accordance with embodiments of the present disclosure.

Turning now to FIG. 3, illustrated is a flowchart of an example method 300 for generating new netnames for each netname in the netlists, according to embodiments. The method 300 may begin at operation 302, where the computer system generates a first hash table for the first netlist and a second hash table for the second netlist. In some embodiments, the first and second hash tables are generated as empty to be filled by the computer system as netnames are analyzed. In some embodiments, the hash table has two columns, the first column for each netname to be used as a key (e.g., a starting point to be augmented by an algorithm) and a second column with new netnames that are outputs of the key and the hash algorithm.

For example, the first netlist may have a first netname: netname521. The computer system may add netname521 in the first column of the first hash table as a key. The hash algorithm used by the first hash table may delete all numerals in the netname521 and sequentially add a new numeral starting from one. The computer system using netname521 as a key and the hash algorithm may output netname1 in the second column. Netname1 may act as the new netname for netname521 in the first netlist.

After the first hash table and second hash table are generated at operation 302, the computer system may proceed to operation 304. At operation 304, the computer system may analyze each statement in the first netlist and the second netlist for each netname. For example, there may be three netnames in the first netlist, and the computer system may identify the three netnames as netname144, netname535, netname121.

After analyzing each statement in the first netlist and the second netlist for each netname at operation 304, the computer system may proceed to operation 306. At operation 306, the computer system may add each netname in the first netlist to the first hash table as keys. For example, the first netlist may have three netnames: netname63, netname41, and netname54. The computer system may place the three netnames in the first hash table as shown in Table 7:

TABLE 7

| First Hash Table | |
| --- | --- |
| Key | Respective New Netname |
| netname63 | netname1 |
| netname41 | netname2 |
| netname54 | netname3 |

Each netname may appear in the first hash table in the order in which it appears in the first netlist (e.g., netname63 corresponding to netname1 because it appears first in the first netlist, netname41 corresponding to netname2 because it appears second, and netname54 corresponding to netname3 because it appears third).

In some embodiments, the computer system may only add netnames to the first hash table that are not already in the first hash table. For example, the first hash table may have four netnames: netname122, netname233, netname344, and netname233. The computer system will populate the first hash table as shown in Table 8:

TABLE 8

First Hash Table

| Key | Respective New Netname |
|---|---|
| netname122 | netname1 |
| netname233 | netname2 |
| netname344 | netname3 |

The computer system may not add the second netname233 to the first hash table as the fourth corresponding netname because it has already been added to the first hash table. By not repeating netnames in the hash table, the computer system may generate respective new netnames once for each netname.

After adding each netname in the first netlist to the first hash table as keys at operation 306, the computer system may continue to operation 308. At operation 308, the computer system may add each netname in the second netlist to the second hash table as keys. For example, the second netlist may have three netnames: netname78, netname89, and netname91. The computer system may place the three netnames in the second hash table as shown in Table 9:

TABLE 9

Second Hash Table

| Key | Respective New Netname |
|---|---|
| Netname78 | netname1 |
| Netname89 | netname2 |
| Netname91 | netname3 |

Each netname may appear in the second hash table in the order in which it appears in the second netlist.

After adding each netname in the second netlist to the second hash table as keys at operation 308, the computer system may proceed to operation 310. At operation 310, the computer system may produce each new netname using the netnames as keys. In some embodiments, the first hash table and the second hash table may use hash algorithms that remove the numerals from the netnames. The hash algorithms can further sequentially add numerals, starting at 1 (or any other designated starting point or method for generating a next number), to the end of the netnames to produce new netnames. For example, the first hash table and the second hash table may appear as shown in Table 10:

TABLE 10

| First Hash Table | | Second Hash Table | |
|---|---|---|---|
| Key | New Netname | Key | New Netname |
| netname343 | netname1 | netname565 | netname1 |
| netname655 | netname2 | netname121 | netname2 |
| netname989 | netname3 | netname897 | netname3 |

The first netlist may have netnames netname343, netname655, and netname989. The computer system may insert the netnames into the first hash table as a key and the hash algorithm used by the first hash table may remove the numerals from each netname, leaving netname343, netname655, and netname989 as netname. The computer system may then use the hash algorithm to sequentially add numerals to the end of the netnames starting at 1 and the sequential numerals may correspond to the order of how the netnames appear in the first netlist.

That is, new netname 1 is generated for netname 343 because it is the first netname to be identified in the first netlist. Netname655 is generated a new netname of netname2 because it is the second netname to be identified in the first netlist. Lastly, netname989 is generated a new netname of netname3 because it is the third netname to be identified in the first netlist.

Additionally, the second netlist may have netnames netname565, netname121, and netname897. The computer system may insert the netnames into the second hash table as a key, and the hash algorithm used by the second hash table may remove the numerals from each netname leaving netname565, netname121, and netname897 as netname. The computer system may continue to use the hash algorithm to sequentially add numerals to the end of the netnames starting at 1, and the sequential numerals may correspond to the order of how the netnames appear in the second netlist.

That is, netname565 is generated a new netname of netname1 because it is the first netname to be identified in the second netlist. Netname121 is generated a new netname of netname2 because it is the second netname to be identified in the second netlist. Lastly, netname897 is generated a new netname of netname3 because it is the third netname to be identified in the third netlist. It is noted that the new netnames generated in both the first hash table and the second has table are the same. This is to allow the computer system to normalize the first netlist and the second netlist with the same named components instead of using the randomly assigned netnames, which can skew a textual analysis comparison.

Referring now to FIG. 4A, illustrated is a first netlist 400A for a first IC design. The first netlist 400A includes a PRTDEF statement 402A with a time stamp, NET statements 404A, PPIN statements 406A, USGDEF statement 408A with output and input UPIN statements, and USGDEF statement 410A with output and input UPIN statements, according to embodiments. In some embodiments, FIG. 4A is a first netlist before the computer system has normalized the first netlist (e.g., no ordering of statements, removal of time stamps, replacement of netnames, etc.).

It would be recognized by a person having ordinary skill in the art that the UPIN statements defining outputs and inputs are a part of the USGDEF statement 408A that define the usage of other netlists for the first IC design. That is, the UPINs help define the hierarchy of the first netlist, the input UPINS may detail which prior IC designs are used (e.g., USGDEF) to make the first IC design, and the output UPINS may detail what netlist is created by the input UPINS. For example, an IC design is an OR gate, and the first IC design is generated by using the OR gate and an inverter. The first netlist for the first IC design would have a USGDEF statement 408A detailing that the OR gate outputs "UPIN Y OUTPUT ABIST_EN_LOC" when using inputs "UPIN A INPUT net35" and "UPIN B INPUT net018." The USGDEF statement allows the computer to know that the first IC design has a higher hierarchical ranking than the OR gate (e.g., particular IC design used by the first IC design) so that only other IC designs on the hierarchical level of the first IC design can be compared.

In some embodiments, the first netlist may have output and input PPINs. The PPIN statements list all outputs and inputs for the first netlist. This is in contrast to the UPINs that detail the usage of other outputs and inputs in other netlists to define a hierarchy. The PPINs detail the particular outputs produced by the first netlist and the inputs used by the first netlist. For example, a first IC design may be a NOT gate using two inputs and producing one output. The first netlist may show two input PPINs as "PPIN in netname012" and "PPIN in netname032", and one output PPIN as "PPIN out netname232." The program producing the first netlist may randomly generate the netnames given to the components of the PPINs.

Referring now to FIG. 4B, illustrated is a first netlist 400B that includes a PRTDEF statement 402B, PPIN statements 406B, USGDEF statement 408B with output and input UPIN statements, and USGDEF statement 410B with output and input UPIN statements, according to embodiments. In some embodiments, FIG. 4B is the first netlist shown in FIG. 4A after the computer system has normalized the first netlist (e.g., ordered the statements, removed time stamps, replaced netnames, etc.).

To normalize the first netlist, default information given to the statements that are considered arbitrary is removed. For example, PRTDEF statement 402B has the default time-date stamp "TimeStamp="Dec 10 10:09:20 2014"" (i.e., the time-date stamp shown in PRTDEF Statement 402A) removed from the first netlist. NET statements 404A are also removed from the normalized first netlist 400B because they are listings of internal connections that can be found in the PPIN and UPIN statements.

Additionally, to normalize the first netlist, the netnames are replaced with respective new netnames. For example, netname "net019" of PPIN statements 406A becomes "net1" of PPIN statements 406B because it is the first netname to appear after "net35" of NET statements 404A is removed. Netname "net35" is replaced with "net2," netname "net018" is replaced with "net3," and netname "net024" is replaced with "net4." It is noted that sequentially, "net35" and "net018" in USGDEF statement 410A would be "net4" and "net5." However, since "net35" and "net018" first appear in USGDEF statement 408A, they are designated "net2" and "net3," respectively, throughout the rest of the first netlist.

In some embodiments, the input and output UPINs and PPINs may need to be alphabetically ordered to ensure complete normalization. The output UPINS may be ordered above the ordered input UPINS and the output PPINs should be ordered above the input PPINs. In some embodiments, it is noted that the USGDEF statements 408A and 410A remain the same, other than the netnames changing. This is because the USGDEF details another netlist that is used by the first netlist to create a hierarchy. The other netlist is the same for all blocks in the array or blocks that use the other netlist as a component and the time stamp of the other netlist will not change, whereas if the first netlist is updated or modified, the PRTDEF definition will change by default. This is because the PRTDEF statement details only the first netlist.

Figure 5A:
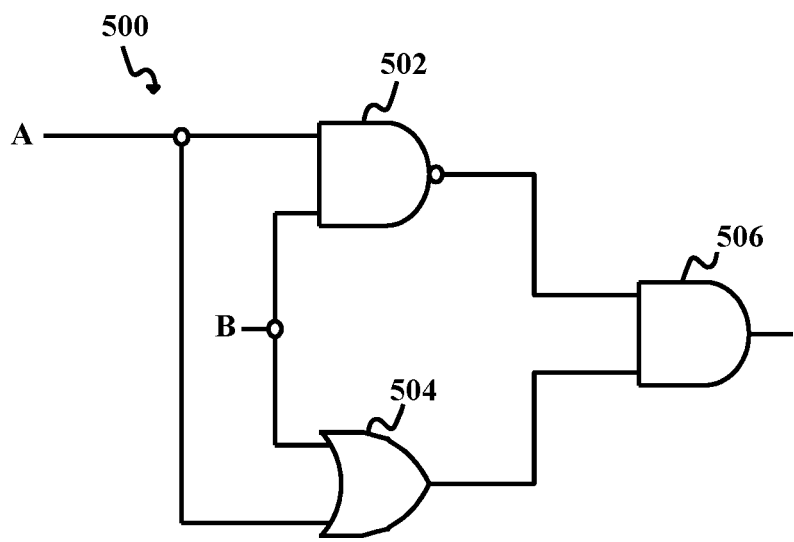
FIG. 5A illustrates an example of a first layout design data of an XOR logic gate, in accordance with embodiments of the present disclosure.
Figure 5B:
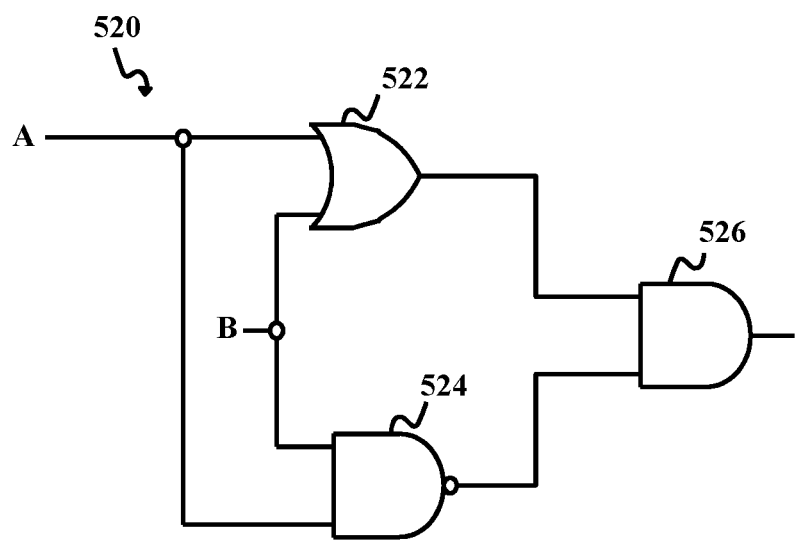
FIG. 5B illustrates an example of a second layout design data of the XOR logic gate, in accordance with embodiments of the present disclosure.

Referring now to FIGS. 5A and 5B, FIG. 5A illustrates the layout design data of an XOR gate 500 that includes a NAND gate 502, an OR gate 504, and an AND gate 506, according to embodiments. FIG. 5B illustrates the layout design data of a second XOR gate 520 that includes an OR gate 522, a NAND gate 524, and an AND gate 526, according to embodiments. Both XOR gates 500 and 520 may have inputs A and B. In some embodiments, the XOR gate 500 is the first IC design and the second XOR gate 520 is the second IC design. In some embodiments, the computer system may compare the XOR gate 500 to the second XOR gate 520 to determine if the shape of the two XOR gates 500 and 520 are the same.

For example, the computer system may superimpose the second XOR gate 520 over the XOR gate 500. The computer system may determine that the NAND gates and OR gates of the XOR gates 500 and 520 have been reversed. That is, the location of the NAND gate 502 in the XOR gate 500 is the same as the location of the OR gate 522 in the second XOR gate 520. Likewise, the OR gate 504 in the XOR gate 500 is in the same location as the NAND gate 524 in the second XOR gate 520. Physically, the design layout data of the XOR gates 500 and 520 do not match and accordingly, despite the netlists matching textually from the components used, the sign-off data for the XOR gate 500 cannot be copied over for the XOR gate 520.

This is because the blocks for the XOR gates 500 and 520 physically work differently, and, therefore, the sign-off data could differ. For example, the XOR gate 500 may take 0.02 picoseconds to relay a current with the NAND gate 502 closer to an input source A. Meanwhile, the XOR gate 520 may be slower, taking 0.1 picoseconds to relay current with the OR gate 522 closer to the input source A.

It would be recognized by a person having ordinary skill in the art that the XOR gates 500 and 520 are Boolean equivalents. That is, the first netlist for the XOR gate 500 would be the same as the second netlist for the second XOR gate 520 because the netlist only shows logical data (e.g., that the XOR gate 500 is an XOR gate made up of a NAND, OR, and AND gate; and the second XOR gate 520 is also an XOR gate made up of a NAND, OR, and AND gate). Without the computer system comparing the layout design data of the first IC design to the second IC design, sign-off data can be mistakenly copied from the first IC design to the second IC design.

Figure 6A:
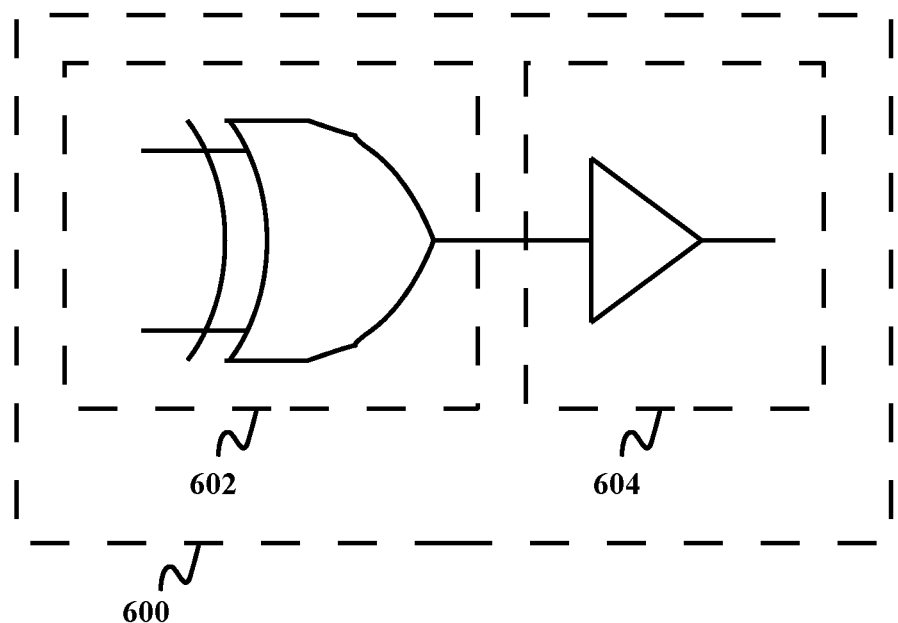
FIG. 6A illustrates an example of a first IC broken into block subcomponents, in accordance with embodiments of the present disclosure.
Figure 6B:
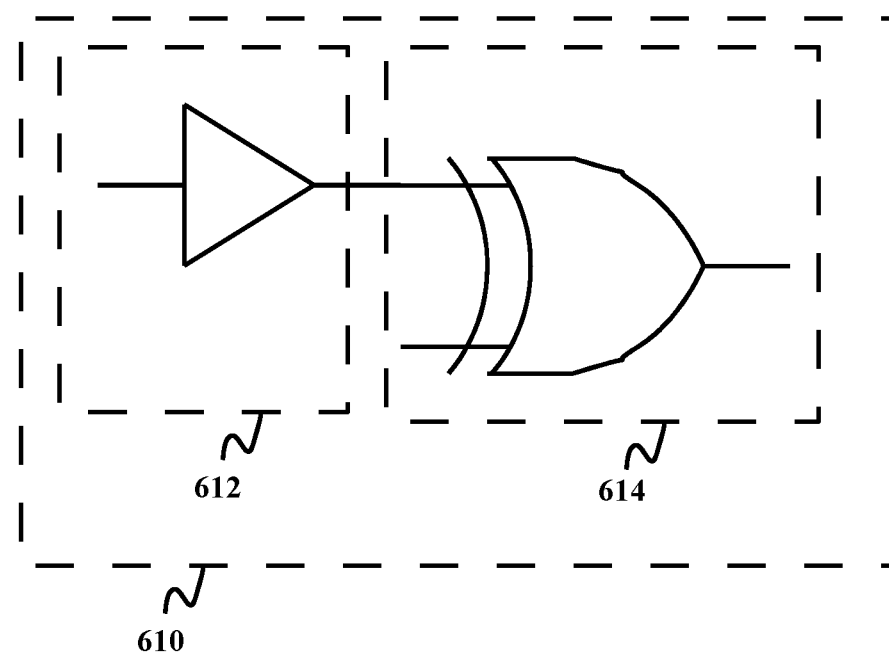
FIG. 6B illustrates an example of a second IC broken into block subcomponents, in accordance with embodiments of the present disclosure.

Referring now to FIGS. 6A and 6B, FIG. 6A illustrates an IC design that has three blocks. An XOR gate is a first block 602, a NOT gate is a second block 604, and a combination of the XOR gate 602 and NOT gate 604 is a third block 600. Similarly, the IC design in FIG. 6B has three blocks. A NOT gate is a first block 612, an XOR gate is a second block 614, and a combination of the NOT gate 612 and XOR gate 614 is a third block 610. In some embodiments, FIG. 6A is a first iteration of an IC and FIG. 6B is a second iteration of the same IC, where each iteration (e.g., FIG. 6A and FIG. 6B) is a Boolean equivalent to one another.

In some embodiments, the first block 602, the second block 604, and the third block 600 in FIG. 6A may be in a hierarchy. For example, the first block 602 and the second block 604 may be on a low hierarchical level because blocks 602 and 604 are single logic gates (e.g. an XOR and NOT gate), and the third block 600 may be on a high hierarchical level because the third block 600 is a combination of the two lower blocks 602 and 604.

In some embodiments, the first block 612, the second block 614, and the third block 610 in FIG. 6B may be in a hierarchy. For example, the first block 612 and the second block 614 may be on a low hierarchical level because blocks 612 and 614 are single logic gates, and the third block 610 may be on a high hierarchical level because the third block 610 is a combination of the two lower blocks 612 and 614.

In some embodiments, the computer system may compare the blocks in FIGS. 6A and 6B, respectively, based on hierarchy. For example, the computer system may determine that there are two blocks (first blocks 602 and 612, and second blocks 604 and 614) in both iterations (FIGS. 6A and 6B) of the IC in the low hierarchical level. The computer system may identify the first block 602 as matching (e.g., physically and schematically) the second block 614 (e.g., both are XOR gates) and copy the sign-off date of the first block 602 to the second block 614 as referenced in method 100. The computer system may also identify the second block 604 as matching the first block 612 (e.g., both are NOT gates) and copy the sign-off data of the second block 604 to the first block 612 as referenced in method 100.

The computer system may then move up in hierarchy to the third blocks 600 and 610. The computer system may determine that the third blocks do not match, either schematically with a netlist or physically by layout, and not copy the sign-off data for the third block 600 to the third block 610. Even though FIGS. 6A and 6B both use the same lower level blocks for which sign-off data can be copied over, the higher level blocks are configured differently and sign-off data cannot be reused. The netlists of the third blocks 600 and 610 do not match because the NET statements detailing the input and outputs would be different when the XOR and NOT gates change positions.

Figure 7:
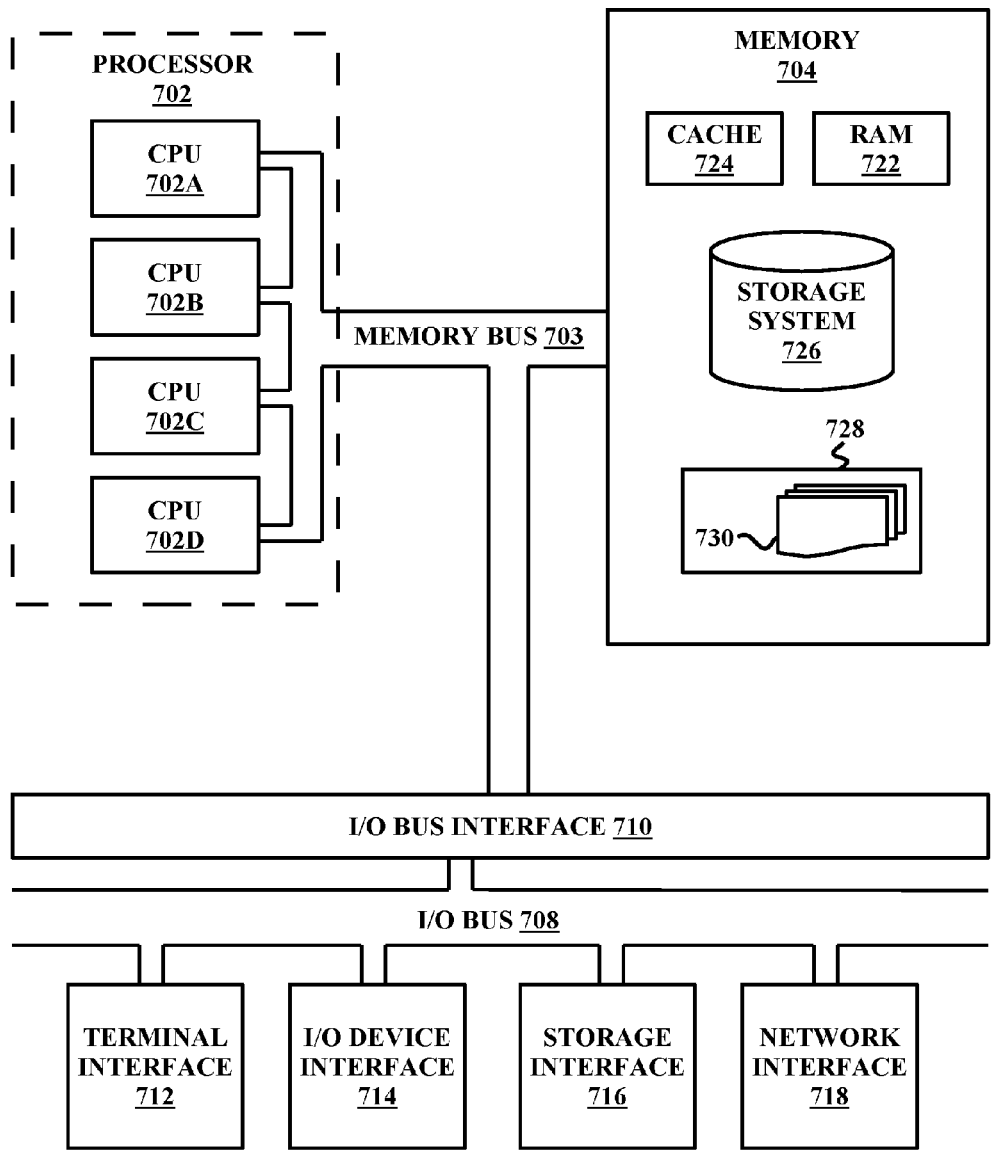
FIG. 7 illustrates a high-level block diagram of an example computer system that may be used in implementing one or more of the methods, tools, and modules, and any related functions, described herein, in accordance with embodiments of the present disclosure.

Referring now to FIG. 7, shown is a high-level block diagram of an example computer system 701 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 701 may comprise one or more CPUs 702 (also referred to as processors herein), a memory subsystem 704, a terminal interface 712, a storage interface 716, an I/O (Input/Output) device interface 714, and a network interface 718, all of which may be communicatively coupled, directly or indirectly, for inter-component communication via a memory bus 703, an I/O bus 708, and an I/O bus interface unit 710.

The computer system 701 may contain one or more general-purpose programmable central processing units (CPUs) 702A, 702B, 702C, and 702D, herein generically referred to as the CPU 702. In some embodiments, the computer system 701 may contain multiple processors typical of a relatively large system; however, in other embodiments the computer system 701 may alternatively be a single CPU system. Each CPU 702 may execute instructions stored in the memory subsystem 704 and may include one or more levels of on-board cache.

Memory subsystem 704 may include computer system readable media in the form of volatile memory, such as random access memory (RAM) 722 or cache memory 724. Computer system 701 may further include other removable/non-removable, volatile/non-volatile computer system storage media. By way of example only, storage system 726 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 704 can include flash memory, e.g., a flash memory stick drive or a flash drive. Memory devices can be connected to memory bus 703 by one or more data media interfaces. The memory subsystem 704 may include at least one program product having a set (e.g., at least one) of program modules that are configured to carry out the functions of various embodiments.

One or more programs/utilities 728, each having at least one set of program modules 730 may be stored in memory 704. The programs/utilities 728 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 728 and/or program modules 730 generally perform the functions or methodologies of various embodiments.

Although the memory bus 703 is shown in FIG. 7 as a single bus structure providing a direct communication path among the CPUs 702, the memory subsystem 704, and the I/O bus interface 710, the memory bus 703 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 710 and the I/O bus 708 are shown as single respective units, the computer system 701 may, in some embodiments, contain multiple I/O bus interface units 710, multiple I/O buses 708, or both. Further, while multiple I/O interface units are shown, which separate the I/O bus 708 from various communications paths running to the various I/O devices, in other embodiments some or all of the I/O devices may be connected directly to one or more system I/O buses.

In some embodiments, the computer system 701 may be a multi-user mainframe computer system, a single-user system, or a server computer or similar device that has little or no direct user interface, but receives requests from other computer systems (clients). Further, in some embodiments, the computer system 701 may be implemented as a desktop computer, portable computer, laptop or notebook computer, tablet computer, pocket computer, telephone, smart phone, network switches or routers, or any other appropriate type of electronic device.

It is noted that FIG. 7 is intended to depict the representative major components of an exemplary computer system 701. In some embodiments, however, individual components may have greater or lesser complexity than as represented in FIG. 7, components other than or in addition to those shown in FIG. 7 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A computer-implemented method comprising:
obtaining, by a processor, a first netlist for a first IC design and a second netlist for a second IC design;
normalizing, by the processor, the first netlist and the second netlist;
determining, by the processor, that the normalized first netlist is the same as the normalized second netlist;
obtaining, by the processor, a first layout design data for the first IC design and a second layout design data for the second IC design;
determining, by the processor, that the first layout design data is the same as the second layout design data;
copying, by the processor, sign-off data of the first IC design to the second IC design in response to determining that the first netlist is the same as the second netlist and that the first layout design data is the same as the second layout design data; and
designing, by the processor, the second IC design based on the copied sign-off data of the first IC design.

2. The method of claim 1, wherein the first IC design is a first release of a particular integrated circuit and the second IC design is a second release of the particular integrated circuit.

3. The method of claim 1, wherein the first netlist is a textual representation of a first schematic design data for the first IC design and the second netlist is a textual representation of a second schematic design data for the second IC design, and wherein the obtaining the first and second netlists comprises:
receiving, by the processor, the first schematic design data and the second schematic design data; and
generating the first netlist using the first schematic design data and the second netlist using the second schematic design data.

4. The method of claim 1, wherein normalizing the first netlist and the second netlist comprises:
identifying one or more statements in the first netlist and the second netlist;
ordering respective statements in the first netlist and the second netlist;
generating new netnames for each netname in each statement; and
replacing each netname with the new netnames.

5. The method of claim 4, wherein generating new netnames for each netname in each statement comprises:
generating a first hash table for the first netlist and a second hash table for the second netlist;
analyzing each statement in the first netlist and the second netlist for each netname; and
adding each netname in the first netlist to the first hash table and each netname in the second netlist to the second hash table as keys; and
producing new netnames for each netname in the first and second hash tables added as keys.

6. The method of claim 1, wherein normalizing the first netlist and the second netlist comprises:
determining that there are one or more proto pin (PPIN) statements in the first netlist and the second netlist, the one or more PPIN statements including output PPIN statements and input PPIN statements;
ordering the output PPIN statements and input PPIN statements alphabetically, the input PPIN statements ordered subsequent to the output PPIN statements;
determining that there are one or more usage definition (USGDEF) statements in the first netlist and the second netlist;

ordering the USGDEF statements alphabetically;
determining that there are one or more usage pin (UPIN) statements in the first netlist and the second netlist, the one or more UPIN statements including output UPIN statements and input UPIN statements; and
ordering the output UPIN statements and input UPIN statements alphabetically, the input UPIN statements ordered subsequent to the output UPIN statements.

7. The method of claim 6, wherein normalizing the first netlist and the second netlist further comprises:
generating a first hash table for the first netlist and a second hash table for the second netlist;
analyzing the one or more PPIN statements and the one or more UPIN statements in the first netlist and the second netlist;
identifying each netname in the one or more PPIN statements and the one or more UPIN statements;
determining whether each netname in the first netlist is in the first hash table and whether each netname in the second netlist is in the second hash table;
adding each netname not already in the first hash table to the first hash table and adding each netname not already in the second hash table to the second hash table; and
generating the new netnames in the first hash table and the second hash table for each netname added to the first hash table and each netname added the second hash table.

8. The method of claim 7, wherein normalizing the first netlist and the second netlist further comprises:
analyzing each line in the first netlist and the second netlist; and
replacing each netname in the one or more PPIN statements and the one or more UPIN statements with each new netname.

9. The method of claim 8, wherein normalizing the first netlist and the second netlist further comprises:
determining that there are one or more printer definition (PRTDEF) statements in the first netlist and the second netlist;
deleting each time-date stamp in the one or more PRTDEF statements;
determining that there are one or more internal connection (NET) statements in the first netlist and second netlist; and
deleting each NET statement in the first netlist and second netlist.

10. The method of claim 1, wherein the sign-off data includes timing data, noise data, extraction data, voltage drop data, design rule checking (DRC) data, and layout versus schematic (LVS) data.

11. A system comprising:
a memory; and
a processor in communication with the memory, the processor being configured to perform operations comprising:
obtaining a first netlist for a first block and a second netlist for a second block;
normalizing the first netlist and the second netlist;
determining that the normalized first netlist is the same as the normalized second netlist;
obtaining a first layout design data for the first block and a second layout design data for the second block;
determining that the first layout design data is the same as the second layout design data;
copying sign-off data of the first block to the second block in response to determining that the first netlist is the same as the second netlist and that the first layout design data is the same as the second layout design data; and designing the second IC design based on the copied sign-off data of the first IC design.

12. The system of claim 11, wherein the operations performed by the processor further comprises:
obtaining a third netlist for a third block and a fourth netlist for a fourth block, wherein the first and third blocks are subcomponents of a first IC design and the second and fourth blocks are subcomponents of a second IC design;
normalizing the third and fourth netlists;
determining that the normalized third netlist is the same as the normalized fourth netlist;
obtaining a third layout design data for the third block and a fourth layout design data for the fourth block;
determining that the third layout design data is not the same as the fourth layout design data; and
determining not to copy sign-off data of the third block to the fourth block in response to determining that the third layout design data is not the same as the fourth layout design data, wherein the sign-off data of the first and second blocks are stored in a first array associated with a first iteration of an IC and the sign-off data of the third and fourth blocks are stored in a second array associated with a second iteration of the IC.

13. The system of claim 11, wherein the first netlist is a textual representation of a first schematic design data for the first block and the second netlist is a textual representation of a second schematic design data for the second block, and wherein the obtaining the first and second netlists comprises:
receiving, by the processor, the first schematic design data and the second schematic design data; and
generating the first netlist using the first schematic design data and the second netlist using the second schematic design data.

14. The system of claim 11, wherein normalizing the first netlist and the second netlist comprises:
identifying one or more statements in the first netlist and the second netlist;
ordering respective statements in the first netlist and the second netlist;
generating new netnames for each netname in each statement; and
replacing each netname with the new netnames.

15. The system of claim 14, wherein generating new netnames for each netname in each statement comprises:
generating a first hash table for the first netlist and a second hash table for the second netlist;
analyzing each statement in the first netlist and the second netlist for each netname; and
adding each netname in the first netlist to the first hash table and each netname in the second netlist to the second hash table as keys to produce each new netname.

16. A computer program product comprising a computer readable storage medium having program instructions embodied therewith, the program instructions executable by a processor to cause the processor to perform a method, the method comprising:
obtaining, a first netlist for a first block and a second netlist for a second block;
normalizing the first netlist and the second netlist;
determining that the normalized first netlist is the same as the normalized second netlist;
obtaining a first layout design data for the first block and a second layout design data for the second block;
determining that the first layout design data is the same as the second layout design data;
copying sign-off data of the first block to the second block in response to determining that the first netlist is the same as the second netlist and that the first layout design data is the same as the second layout design data; and
designing the second IC design based on the copied sign-off data of the first IC design.

17. The computer program product of claim 16, wherein the method performed by the processor further comprises:
obtaining a third netlist for a third block and a fourth netlist for a fourth block, wherein the first and third blocks are subcomponents of a first IC design and the second and fourth blocks are subcomponents of a second IC design;
normalizing the third and fourth netlists;
determining that the normalized third netlist is not the same as the normalized fourth netlist;
determining not to copy sign-off data of the third block to the fourth block in response to determining that the third netlist is not the same as the fourth netlist, wherein the sign-off data of the first and second blocks are stored in a first array associated with a first iteration of an IC and the sign-off data of the third and fourth blocks are stored in a second array associated with a second iteration of the IC.

18. The computer program product of claim 16, wherein the first netlist is a textual representation of a first schematic design data and the second netlist is a textual representation of a second schematic design data, and wherein the obtaining the first and second netlists comprises:
receiving, by the processor, the first schematic design data and the second schematic design data; and
generating the first netlist using the first schematic design data and the second netlist using the second schematic design data.

19. The computer program product of claim 16, wherein normalizing the first netlist and the second netlist comprises:
identifying one or more statements in the first netlist and the second netlist;
ordering respective statements in the first netlist and the second netlist;
generating new netnames for each netname in each statement; and
replacing each netname with the new netnames.

20. The computer program product of claim 19, wherein generating new netnames for each netname in each statement comprises:
generating a first hash table for the first netlist and a second hash table for the second netlist;
analyzing each statement in the first netlist and the second netlist for each netname; and
adding each netname in the first netlist to the first hash table and each netname in the second netlist to the second hash table as keys to produce each new netname.

* * * * *